United States Patent [19]
Knapp et al.

[11] Patent Number: 6,005,904
[45] Date of Patent: Dec. 21, 1999

[54] PHASE-LOCKED LOOP WITH PROTECTED OUTPUT DURING INSTANCES WHEN THE PHASE-LOCKED LOOP IS UNLOCKED

[75] Inventors: David J. Knapp; Tony Susanto; David S. Trager, all of Austin, Tex.

[73] Assignee: Oasis Design, Inc., Austin, Tex.

[21] Appl. No.: 08/951,796

[22] Filed: Oct. 16, 1997

[51] Int. Cl.⁶ .................................................. H03D 3/24
[52] U.S. Cl. ............................... 375/376; 331/DIG. 2; 327/159
[58] Field of Search ....................... 375/376; 331/DIG. 2; 327/156, 159

[56] References Cited

U.S. PATENT DOCUMENTS

| | | | |
|---|---|---|---|
| 4,534,044 | 8/1985 | Funke et al. | 375/374 |
| 4,849,998 | 7/1989 | Poklemba | 375/377 |
| 5,123,030 | 6/1992 | Kazawa et al. | 375/294 |
| 5,184,350 | 2/1993 | Dara | 370/466 |
| 5,406,590 | 4/1995 | Miller et al. | |
| 5,579,353 | 11/1996 | Parmenter et al. | 375/376 |
| 5,633,855 | 5/1997 | Naito | |
| 5,663,687 | 9/1997 | Kozu | |
| 5,838,749 | 11/1998 | Casper et al. | 375/376 |

FOREIGN PATENT DOCUMENTS

| | | |
|---|---|---|
| 766 404 A2 | 4/1997 | European Pat. Off. |
| 766 404 A3 | 4/1997 | European Pat. Off. |

OTHER PUBLICATIONS

English Abstract for Patent Abstract of Japan; Publication No. 06268518; Publication Date Sep. 22, 1994; Application Date Mar. 9, 1993; Application No. 05076179; Applicant Sony Corp.

International Search Report for PCT/US 98/21512 mailed on Feb. 12, 1999.

*Primary Examiner*—Stephen Chin
*Assistant Examiner*—Lenny Jiang
*Attorney, Agent, or Firm*—Kevin L. Daffer; Conley, Rose & Tayon

[57] ABSTRACT

A circuit is provided for controlling or regulating a phase-locked loop (PLL) output during times when the PLL is unlocked. Noise or corruption on the input signal of the PLL may cause the PLL output frequency to suddenly rise to match the input signal frequency. In many instances, the noise or corruption cannot be filtered by the low pass filter within the PLL. A detection circuit is coupled to receive the input signal, and discern times in which non-filterable noise occurs. The detection circuit may include a decoder which decodes, e.g., error correction coding within the input signal data stream to indicate possible instances in which the PLL will unlock. Once the detection circuit indicates an unlock condition and forwards an unlock selection signal to a multiplexer, the multiplexer chooses a frequency divided clocking signal rather than the PLL output clocking signal. The frequency divided clocking signal transitions at a rate acceptable to a digital processor, while the PLL output clocking signal during an unlock state is not acceptable. Thus, the digital processor can maintain its operating state during times when the PLL clocking signal exceeds the processor maximum operation frequency.

15 Claims, 2 Drawing Sheets

PHASE-LOCKED LOOP WITH PROTECTED OUTPUT DURING INSTANCES WHEN THE PHASE-LOCKED LOOP IS UNLOCKED

BACKGROUND OF THE INVENTION

1. Field of the Invention

This invention relates to an integrated circuit embodying a phase-locked loop ("PLL") and, more particularly, to a mechanism for controlling frequency of an output signal forwarded from the PLL whenever the PLL is unlocked.

2. Description of the Related Art

A PLL is generally used in many areas of electronics to control the frequency and/or phase of a signal. Instances of use include, for example, applications in frequency synthesizers, analog-digital modulators and demodulators, and clock recovery circuits.

Clock recovery is a term generally used to describe the derivation of a clocking signal. The clocking signal is produced without having to add a timing reference to the circuit which requires the clocking signal. Clock recovery circuits therefore arise when deriving a clocking signal from data transmitted across a communication channel or network. As the stream of data flows across the channel, the clocking signal is constructed and synchronized from transitions of the data. Thus, timing information (i.e., the clocking signal) is recovered from a data stream at the receiving end of, for example, a fiberoptic transmission channel. Avoidance in having to add a separate clock transmission medium or a clock generation circuit at the receiving end circuit is paramount as to the reasons for clock recovery in general.

The PLL compares the arrival of signal transitions on the incoming data stream with the PLL internally generated clock to increase or decrease frequency of the output signal produced from the PLL. Comparison of frequency and phase continues until the incoming data stream can be correctly decoded. Once the correct data is decoded, the PLL is said to be "locked". More specifically, a PLL is considered locked if the phase and/or frequency difference between the incoming data transitions and the PLL internally generated clock is equal or constant with time. If the PLL does not contain an internal clock divider within its feedback loop, then a locked PLL is one that implies an equal frequency and phase between the incoming data frequency (i.e., input signal frequency) and a clocking signal output from the PLL (i.e., output signal frequency).

For robust operation, the PLL must be designed so that it can operate over a wide frequency lock range. A wide range is needed to ensure that the PLL can lock to the input signal data under almost all possible conditions of component variations within the PLL circuit. This wide frequency lock range can produce a wide range of clock frequencies produced at the PLL output. On the other hand, a digital processor connected to receive the PLL output clocking signal will require the output clocking signal frequency not exceed the maximum operating frequency of the processor. Therefore, the recovered clock (i.e., output signal produced by the PLL) must be one which can be controlled so that it does not exceed the maximum operating frequency of the processor if short- and long-term variations in the incoming data stream phase and/or frequency occur.

The incoming data stream to a PLL can oftentimes be temporarily disrupted by, for example, noise placed on the transmission channel. Noise of relatively short duration can in most instances be removed by a low pass filter arranged within the PLL. It is not until, however, several sequential data bits change in phase and/or frequency that the low pass filter can no longer discern and therefore filter that variation.

One example of a relatively long-term variation is shown in reference to FIG. 1. In particular, an optical connector 10 is shown connected to one end of a fiberoptic cable 12. Cable 12 comprises a cylindrical core 14 arranged in contact with the inner surface of a cladding material 16. Core 14 is made of a transparent dielectric material having a refractive index preferably greater than cladding 16.

Connector 10 includes a mechanical attachment mechanism 18 for securing it to cable 12. Connector 10 houses at least one photodetector 20. Photodetector 20 includes any device capable of accepting light energy and converting into an electrical signal. Popular photodetectors include solid state devices, such as silicon photodiodes, phototransistors, and photo-Darlingtons.

To ensure accurate reproduction, coupling between connector 10 and cable 12 must be carefully and precisely made. Special connectors have been designed to mechanically mate and align the transmission path of cable 12 to its respective photodetector 20. Those connectors afford multiple connect and disconnect while maintaining proper alignment in the interim. Unfortunately, each time connector 10 is displaced from cable 12, the phase read by photodetector 20 of any data forwarded through cable 12 changes. Thus, only minor change in the spatial relationship between photodetector 20 and the distal end of cable 12 modify the phase and/or frequency recorded by photodetector 20. If the distance between photodetector 20 and cable 12 is altered (e.g., by disconnect or connect) while data stream 22 is being transmitted, the integrity of data stream 22 may be corrupted. Incorrectly formed transitions of data stream 22 which last for a sufficiently long time are, unfortunately, recorded by the PLL which then attempts to recover a clocking signal based on those transitions.

A relatively long duration of corrupted data cannot be removed by the low pass filter, and will instead cause the PLL clocking signal frequency to rapidly rise or fall. The clocking signal output from the PLL is, unfortunately, forwarded to digital circuits at the receive end of the fiberoptic cable. For example, the digital circuits may include a digital processor which is intended to operate within a pre-defined operating frequency. If the PLL clocking signal (forwarded as an output signal from the PLL) as presented to the digital processor clock input exceeds the maximum frequency of that processor, then the processor will malfunction.

SUMMARY OF THE INVENTION

The problems outlined above are in large part solved by an improved apparatus, preferably formed as an integrated circuit containing a PLL. In particular, an improved circuit is presented in which the clocking signal frequency output from the PLL is controlled during times when the PLL is unlocked. During instances in which the PLL is unlocked, the clocking signal is regulated to a lower frequency than what would normally be produced from the PLL. That regulated frequency is one chosen to be within the operating frequency of the digital circuit and/or processor.

According to one embodiment, a detection circuit is used to determine when the data stream is corrupted. Sufficient corruption for a sufficient amount of time is decoded as an unlock signal. The unlock signal serves to select a frequency divided clocking signal output from a clock divider circuit. The clock divider circuit is coupled between the output from the PLL and a multiplexer, whose input is selectable by the current state of the unlock signal. The multiplexer is coupled to receive a frequency divided clocking signal output from the clock divider and the clocking signal output from the PLL. During times when the unlock signal is asserted, the multiplexer selects the frequency divided clocking signal; during times when the unlock signal is not present, the multiplexer selects the clocking signal output from the PLL. Accordingly, the frequency divided clocking signal is derived from and of lesser frequency than the clocking signal. Selectable output from the multiplexer is connected to the clocking input of the digital circuit/processor.

Broadly speaking, the present invention contemplates a PLL. The PLL comprises a detection circuit adapted for receiving an input signal forwarded to the PLL. The detection circuit is further adapted for dispatching an unlock signal indicating a change in frequency of the input signal. The change in frequency may be brought about by movement of the coupling relative the fiberoptic cable. The change in frequency can be of long duration dictated by the time it takes to disconnect and/or reconnect the connector to the cable. A multiplexer is further included to receive the unlock signal. Responsive to the unlock signal the multiplexer can select as input to a digital process a frequency divided clocking signal rather than the normal PLL clocking signal.

The present invention further contemplates an integrated circuit for selectively controlling the operating frequency of a digital processor. According to one embodiment, the integrated circuit includes a PLL, a clock divider circuit and a multiplexer. According to another embodiment, the clock divider circuit and the multiplexer form a part of the PLL. The PLL produces an output signal in response to an input signal. If the PLL is locked and clock division/multiplication within the PLL does not occur, the input and output signal frequencies are substantially equal. If the frequency of the input signal exceeds a pre-defined amount, an unlock condition may occur momentarily. A detection circuit senses the unlock condition and dispatches an unlock signal to the multiplexer. The unlock signal selects either the output signal (i.e., clocking signal) forwarded from the PLL or a frequency divided clocking signal forwarded from the clock divider circuit. On receiving an unlock signal, the multiplexer selects the frequency divided clocking signal; on receiving a lock signal, the multiplexer selects the output signal. The selected signal and, more particularly, the frequency of the selected signal is forwarded to the clocking input of the digital processor to ensure the digital processor does not operate outside its specified frequency range.

BRIEF DESCRIPTION OF THE DRAWINGS

Other objects and advantages of the invention will become apparent upon reading the following detailed description and upon reference to the accompanying drawings in which.

Figure 1:
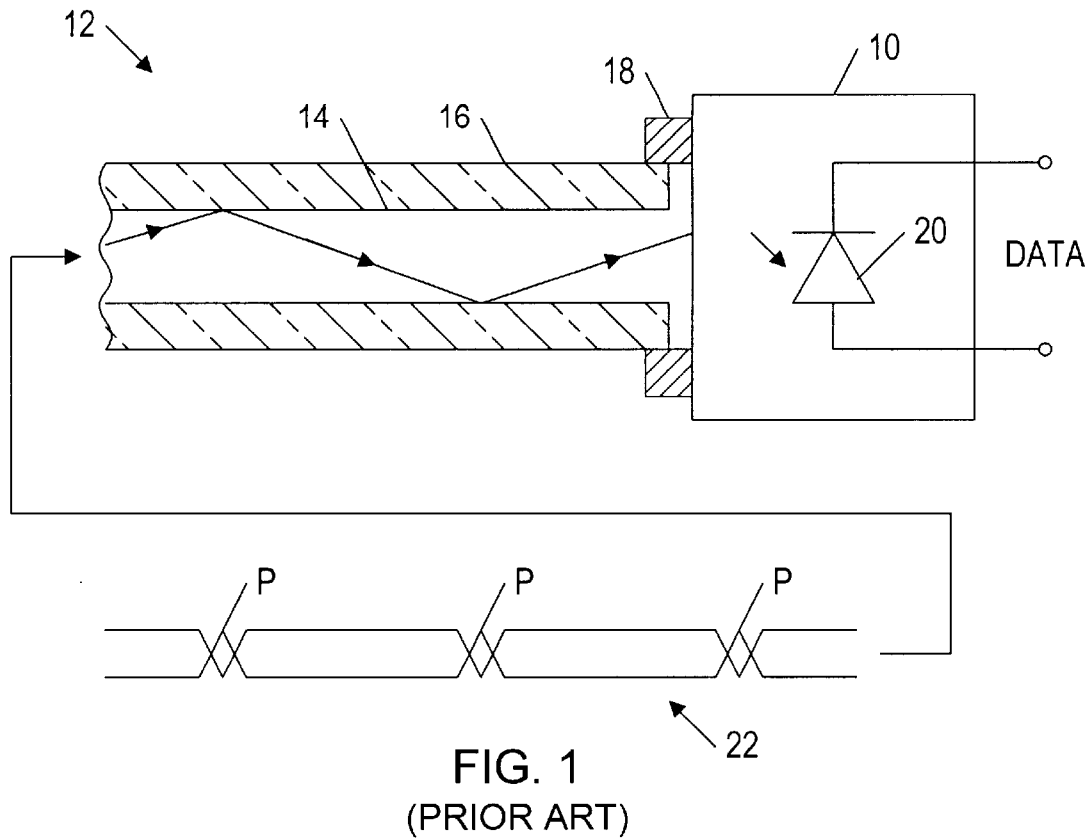
FIG. 1 is a partial cross-sectional view of a fiberoptic cable having a data stream forwarded to one end of the cable and a connector containing a photodetector coupled to the other end of the cable.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
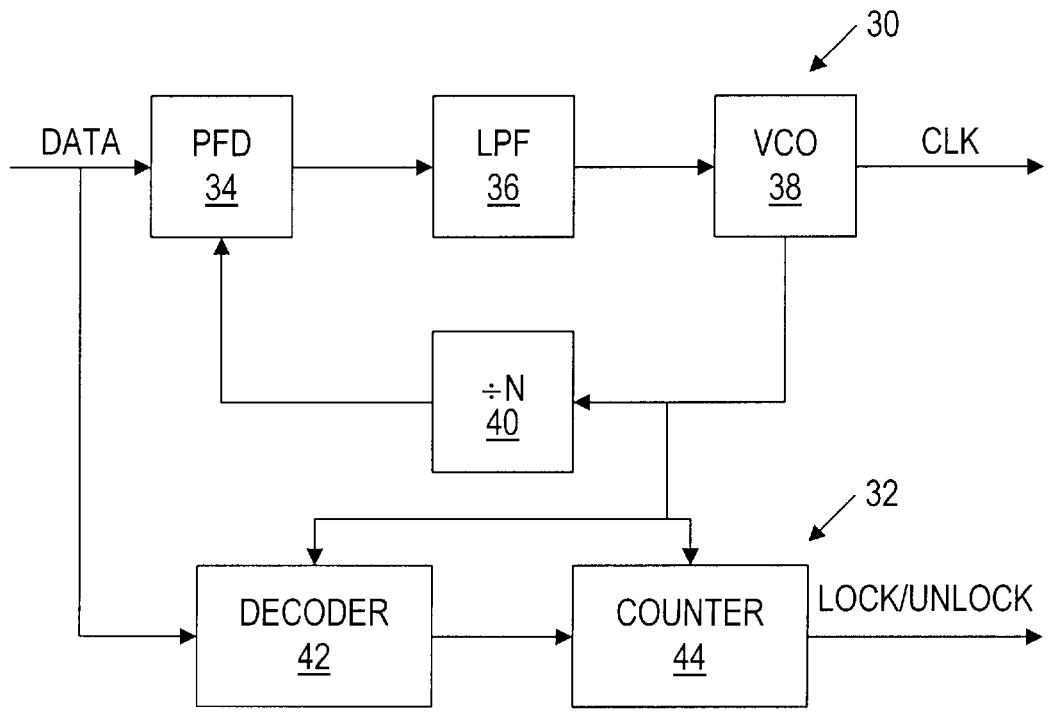
FIG. 2 is a block diagram of a PLL and a detection circuit coupled to receive an input signal and produce a clocking signal and a lock/unlock signal, respectively.

Turning now the drawings, FIG. 2 depicts a PLL 30. As part of PLL 30, or separate from PLL 30, is a detection circuit 32. In its simplest form, PLL 30 comprises a phase/frequency detector 34, a low pass filter 36 and a feedback loop potentially closed by a voltage-controlled oscillator 38. The phase detector portion of phase/frequency detector 34 produces an output whose DC value is proportional to a phase difference between the input signal (i.e., data) and the voltage-controlled oscillator ("VCO") signal. The frequency detector portion detects frequency differences between those signals. Therefore, a combination of phase and frequency detection proves extremely useful since it can significantly increase the acquisition range and lock speed of the PLL. Low pass filter 36 suppresses high frequency components in the phase/frequency detector 34 output, allowing the DC value to control the VCO output frequency. Thus, low pass filter 36 generates the proper control voltage for VCO 38. The control voltage will act to change the output phase and frequency of the VCO to that of the input signal.

The phase/frequency detector can be formulated, for example, as a multiplier (or mixer) comprising an exclusive OR gate, a R-S latch or, in the instance of frequency detection, any circuit which produces non-complimentary outputs proportional to the frequency differences between the inputs. In its simplest form, a low-pass filter can be implemented with passive elements comprising a capacitor and resistor linked between conductors bearing the input signal and the output signal. A VCO can be implemented, for example, as a ring oscillator comprising an odd number of series connected inverters.

The components shown in PLL 30 can be made in numerous different ways. For example, phase/frequency detector 34 need only have a phase detection component, if desired. Thus, the mechanism and circuitry needed to embody each component can vary depending upon the accuracy and application desired. The examples described above are therefore only examples of ways to implement each component. Variations and modifications may be made to the form and structure of each component as mandated by the application in which the components are placed.

PLL 30 may be called upon to have a frequency of the output signal be a multiple of the input signal frequency. Multiplying the input signal frequency preferably takes place in the feedback loop, whereby the output signal frequency is reduced (i.e., divided) before it is fed back to phase/frequency detector 34. The divisor can be modified depending on the amount of frequency multiplication needed. Thus, clock divider 40 includes a divisor amount N equal to or greater than 1.0. If multiplication is not needed, then N equals 1.0. Clock divider 40 is essentially a frequency divider which can be suitably configured as, for example, a digital counter.

Detection circuit 32 is coupled to receive the input signal. According to one embodiment, detector circuit 32 includes a decoder 42 and a counter 44. Decoder 42 continuously decodes the input signal and signals the occurrence of a pattern that matches a predefined set of valid preambles. Thus, decoder 42 may be designed to decode a specific sequence of binary bits. The sequence being sought is preferably contained within a set of preambles (shown as "P" in FIG. 1) of the data stream. The preamble contains a coding which is set upon transmission. If coding changes due to, for example, noise within the transmission channel or corruption as a result of connector misalignment or detachment, then the binary sequence will change. Decoder 42 is designed to decode a specific set of bits within the preambles. If that set does not occur for a set period of time, possibly indicated by a certain count within counter 44, then the lock/unlock signal will indicate an unlock condition. Counter 44 is a modulo N counter where N clock cycles is the time period between preambles. When PLL 30 is unlocked, detection of a valid preamble by the decoder resets counter 44 in the following clock cycle to synchronize it with the incoming data. If a valid preamble is detected after exactly N clock cycles, decoder 44 indicates one valid preamble has been detected. Otherwise it indicates that an invalid preamble has been detected. A preamble decoded after fewer than N clock cycles will reset counter 44 to resynchronize it again. When, for example, three valid preambles have been detected correctly, lock is declared. If PLL 30 is locked, the detection of two invalid preambles by the lock detector will cause it to declare an unlock.

The unlock condition is commensurate with a variation in frequency of the input signal caused by noise or corruption as read by the photodetector. The amount of noise or corruption must be sufficient to cause a change in the binary values of bits within the preambles. That change being unrecognizable by decoder 42, and therefore counter 44 begins counting. It is preferred that decoder 42 and counter 44 by synchronized with the output signal clocking frequency. As such, the output signal frequency clocks decoder 42 and counter 44 as shown.

If decoder 42 is capable of recognizing binary bits within the preamble, then the counter will reset after a predetermined number of recognized preambles, causing the lock/unlock signal to transition back to a lock condition. The lock condition is commensurate with a constant phase and substantially equal frequency between the input signal and the signal forwarded via feedback - that signal being the clocking signal or a frequency divided clocking signal. An unlock condition indicates a variable phase and frequency difference between those signals.

Figure 3:
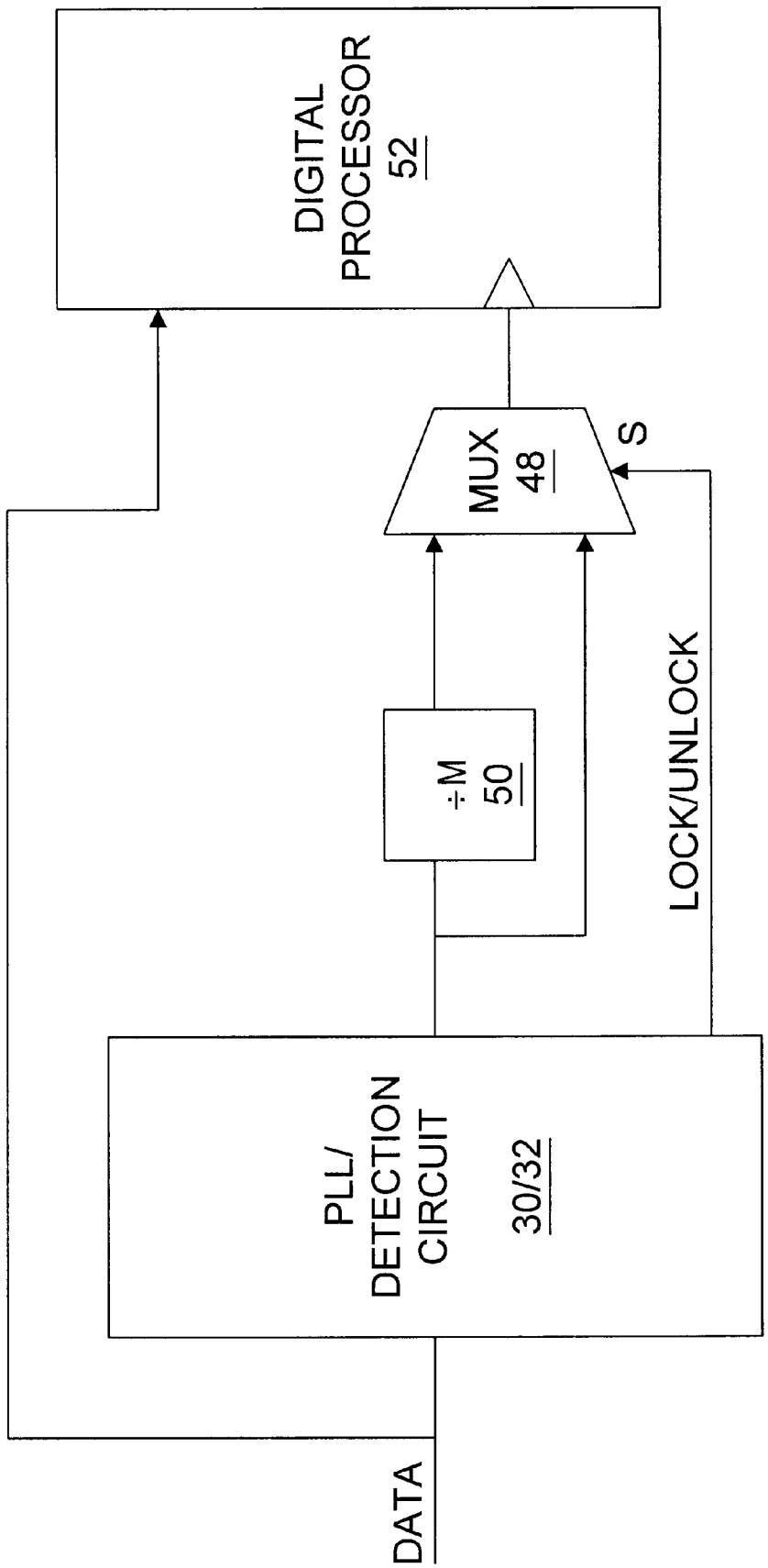
FIG. 3 is a block diagram of a multiplexer coupled to forward to a digital processor clock input either the clocking signal or a frequency divided clocking signal produced from a clock divider circuit, based on the status of the lock/unlock signal.

FIG. 3 illustrates a multiplexer 48 and a clock divider circuit 50. Output from PLL 30 is an output signal which can be fed directly to multiplexer 48, or frequency divided by circuit 50. The frequency divided clocking signal output from circuit 50 is then fed to multiplexer 48. A select input of multiplexer 48 chooses between the clocking signal output directly from PLL 30 or the frequency divided clocking signal from circuit 50. If the lock/unlock signal asserts an unlock condition, then multiplexer 48 selects the frequency divided clocking signal for input to the clock terminal of digital processor 52. If the lock/unlock signal indicates lock condition, then the clocking signal output directly from PLL 30 will be fed to the clock input of digital processor 52.

FIG. 3 illustrates a mechanism to prevent digital processor 52 clock from exceeding its maximum operating frequency. The mechanism is used to divide the clocking signal sent to digital processor 52 by an appropriate factor, denoted as M in frequency divider circuit 50, whenever PLL 30 unlocks. Since PLL 30 will not lock to the corrupted data, given sufficient error coding employed within that data, digital processor 52 is protected from malfunction while PLL 30 is unlocked. If correct data resumes, PLL 30 will lock to the input signal data rate and restore the normal PLL clocking output directly to digital processor 52.

The protection mechanism shown in FIG. 3 is beneficial when power is applied to the various components and then disturbance occurs at the cable/connecter interface. The PLL will attempt to recover that disturbance, possibly in the form of a relatively high clock frequency. Specifically, the PLL will receive via the photodetector a sudden increase in data rate when the connecter interface is disturbed. That increase will make the PLL believe it is clocking too slow, and therefore the PLL will increase the output signal frequency to try and match the input signal frequency. In so doing, the PLL will unlock. The unlock condition will be immediately detected by the detection circuit looking at the incoming data stream concurrent with that data stream entering the PLL. Detection therefore occurs during PLL transients to cause immediate protection at the output of the PLL prior to entering the digital processor. Decoding an unlock condition concurrent with that condition's effect on the PLL affords immediate responsiveness, and regulation, prior to transferring the unlocked (unregulated high frequency) to the digital processor. Intervention is achieved in a relatively simplistic fashion using a clock divider and a multiplexer to scale down the clocking signal seen by the digital processor as soon as an unlock state occurs. Reducing the clocking signal to a portion of what would be a relatively high clocking output from an unlocked PLL prevents the digital processor from operating outside its maximum operating frequency. The amount of clock division within circuit 50 can be varied depending on the potential high frequency output from PLL, and the acceptable operating frequency of digital processor 52.

It is intended that the present system derive a clocking signal to be forwarded to the digital processor 52 from the data rate of a data stream forwarded across the transmission channel. Accordingly, the present architecture is chosen for a clock recovery function. It is recognized that the data rate can change significantly, depending on the transmitter, receiver and transmission media. For this reason, PLL 30 must operate over a relatively wide frequency range to match the changing data rate. VCO data rate within PLL 30 cannot, therefore, be crystal controlled, or fixed in any manner to a specific, limited frequency range. A VCO which can extend its output based on a variable input frequency data stream to a range of relatively wide frequency is therefore beneficial to producing a cost-effective PLL and/or clock reference.

It will be appreciated by those skilled in the art having the benefit of this disclosure, that this invention is believed to be capable of applications with any integrated circuit having both analog and digital portions. The integrated circuit may include the PLL, the detection circuit, the clock divider circuit, the multiplexer, and possibly the digital processor all within a single monolithic substrate. It is to be understood that the invention shown and described is to be taken as a presently preferred embodiment. Various modifications and changes may be made to each and every component within the integrated circuit, as well as each and every component within the PLL, all of which would be obvious to a person skilled in the art without departing from the spirit and scope of the invention as set forth in the claims. It is intended that the following claims be interpreted to embrace all such modifications and changes and accordingly, the specification and drawings are to be regarded in an illustrative rather than a restrictive sense.

What is claimed is:

1. An apparatus, comprising:
   a phase-locked loop coupled to receive an input signal;
   a detection circuit coupled to receive the input signal and to dispatch an unlock signal if the frequency of the input signal exceeds a pre-defined amount; and
   a multiplexer, upon receiving the unlock signal directly from the detection circuit, is adapted for selecting a frequency divided clocking signal produced from an output of the phase-locked loop.

2. The apparatus as recited in claim 1, wherein said detection circuit comprises a decoder.

3. The apparatus as recited in claim 1, wherein said detection circuit comprises a decoder and a counter serially coupled to one another for dispatching the unlock signal when the input signal comprises at least two successive sets of erroneous binary code.

4. The apparatus as recited in claim 3, wherein said erroneous binary code comprises a sequence of binary bits dissimilar from a pre-defined sequence of binary bits.

5. The apparatus as recited in claim 1, wherein said unlock signal is dispatched during times when the frequency exceeds a pre-defined amount.

6. The apparatus as recited in claim 1, wherein said frequency divided clocking signal is output from a clock divider circuit coupled to receive an output signal from the phase-locked loop.

7. The apparatus as recited in claim 6, wherein said clock divider circuit is coupled to divide a frequency of the output signal forwarded from the phase-locked loop.

8. The apparatus as recited in claim 7, wherein the frequency of the output signal is at least equal to the frequency of the input signal.

9. The apparatus as recited in claim 1, further comprising a digital processor coupled to receive the frequency divided clocking signal.

10. An integrated circuit for selectively controlling the operating frequency of a digital processor, comprising:
    a phase-locked loop coupled to receive an input signal and, in response to the input signal, to produce an output signal;
    a detection circuit coupled to receive the input signal and to dispatch an unlock signal if the frequency of the input signal exceeds a pre-defined amount;
    a clock divider circuit coupled to receive the output signal and divide the frequency of the output signal to produce a frequency divided clocking signal; and
    a multiplexer coupled to forward the frequency divided clocking signal to the digital processor upon receiving the unlock signal directly from the detection circuit.

11. The integrated circuit as recited in claim 10, wherein said frequency divided clocking signal transitions at a frequency which is a division of the frequency of the output signal.

12. The integrated circuit as recited in claim 10, wherein said multiplexer is coupled to receive said frequency divided clocking signal, said output signal and said unlock signal.

13. The integrated circuit as recited in claim 10, wherein said detection circuit is further coupled to dispatch a lock signal if the frequency of the input signal is less than the pre-defined amount.

14. The integrated circuit as recited in claim 13, wherein said multiplexer is coupled to forward the output signal to the digital processor upon receiving the lock signal.

15. The integrated circuit as recited in claim 10, wherein said frequency divided clocking signal is strobed at a frequency within the operating frequency of the digital processor.

* * * * *